United States Patent
Kumar et al.

(10) Patent No.: US 10,558,774 B1
(45) Date of Patent: Feb. 11, 2020

(54) ELECTRONIC LIBRARY AND DESIGN GENERATION USING IMAGE AND TEXT PROCESSING

(71) Applicant: Cadence Design Systems, Inc., San Jose, CA (US)

(72) Inventors: Hitesh Mohan Kumar, Greater Noida (IN); Raghav Sharma, Greater Noida (IN)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 86 days.

(21) Appl. No.: 15/863,557

(22) Filed: Jan. 5, 2018

(51) Int. Cl.
*G06F 17/50* (2006.01)
*G06T 7/143* (2017.01)
*G06K 9/32* (2006.01)
*G06T 7/11* (2017.01)

(52) U.S. Cl.
CPC ....... *G06F 17/5045* (2013.01); *G06K 9/3233* (2013.01); *G06T 7/11* (2017.01); *G06T 7/143* (2017.01)

(58) Field of Classification Search
CPC .................................................. G06F 17/5045
USPC ........................................................ 716/100
See application file for complete search history.

(56) References Cited

U.S. PATENT DOCUMENTS

| | | | |
|---|---|---|---|
| 6,865,726 B1 | 3/2005 | Igusa et al. | |
| 7,549,133 B2* | 6/2009 | Lee | G06F 17/505 716/104 |
| 8,160,858 B2 | 4/2012 | Tseng et al. | |
| 8,427,502 B2 | 4/2013 | Choudhary et al. | |
| 8,516,415 B1 | 8/2013 | Khomoutov et al. | |
| 9,594,858 B1 | 3/2017 | Tseng et al. | |
| 9,645,715 B1 | 5/2017 | Jain et al. | |
| 2005/0091626 A1* | 4/2005 | Okano | G06F 17/5045 716/139 |
| 2016/0110483 A1* | 4/2016 | Koo | G06F 17/5009 716/113 |
| 2019/0012424 A1* | 1/2019 | Brookshire | G06F 17/5081 |

* cited by examiner

*Primary Examiner* — Suresh Memula
(74) *Attorney, Agent, or Firm* — Foley & Lardner LLP (57) ABSTRACT

The present embodiments are generally directed to electronic circuit design and verification and more particularly to techniques for generating electronic design element symbols for electronic circuit design tool libraries and designs in any desired format. In embodiments, such electronic design element symbols can be generated from a datasheet or any other image using image processing, graphical shape and text recognition techniques. Embodiments use step by step processing to extract feature vectors from a symbol/design image, apply text and graphical shapes recognition using models, apply techniques for data association and write the final output for targeted systems. These and other embodiments can feed back the output data for further refinement of the recognition models.

16 Claims, 9 Drawing Sheets

ELECTRONIC LIBRARY AND DESIGN GENERATION USING IMAGE AND TEXT PROCESSING

TECHNICAL FIELD

The present embodiments relate generally to electronic circuits, and more particularly to generating library and design component descriptions for tools that design and verify electronic circuits.

BACKGROUND

Electronic Design Automation (EDA) tools are computer and software systems that are used to design and verify electronic circuits such as integrated circuits, application specific integrated circuits (ASICs) and printed circuit boards (PCBs). Many EDA tools have software libraries from which components can be selected for inclusion in the design, which design can then be saved in one or more computer files. Such EDA tools from different vendors or even the same vendor can have different file formats for their libraries and designs, which formats are often not generically interchangeable. Accordingly, problems can arise during the process for designing an electronic circuit when a component is needed to be accessed either from a library or a design, but the particular EDA tool does not have the component available in the EDA tool's own format or cannot recognize the format in which the component exists in the library or design. A solution to these and other problems is therefore desirable.

SUMMARY

The present embodiments are generally directed to electronic circuit design and verification and more particularly to techniques for generating component symbols for electronic circuit design tool libraries and designs in any desired format. In embodiments, such component symbols can be generated from a datasheet or any other image using image processing, graphical shape and text recognition and machine learning techniques. Embodiments use step by step processing to extract feature vectors from a symbol/design image, apply text and graphical shapes recognition using models, apply techniques for data association and write the final output for targeted systems. These and other embodiments can feed back the output data for further refinement of the recognition models.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments are directed to techniques for generating symbols of components or other electronic design elements for electronic circuit design tool libraries and designs in any desired format. In embodiments, such component or element symbols can be generated from a datasheet or any other image using image processing and graphical shape and text recognition. Embodiments use step by step processing to extract feature vectors from a symbol/design image, apply text and graphical shapes recognition using models, apply techniques for data association and write the final output for targeted systems. These and other embodiments can feed back the output data for further refinement of the recognition models.

Figure 1:
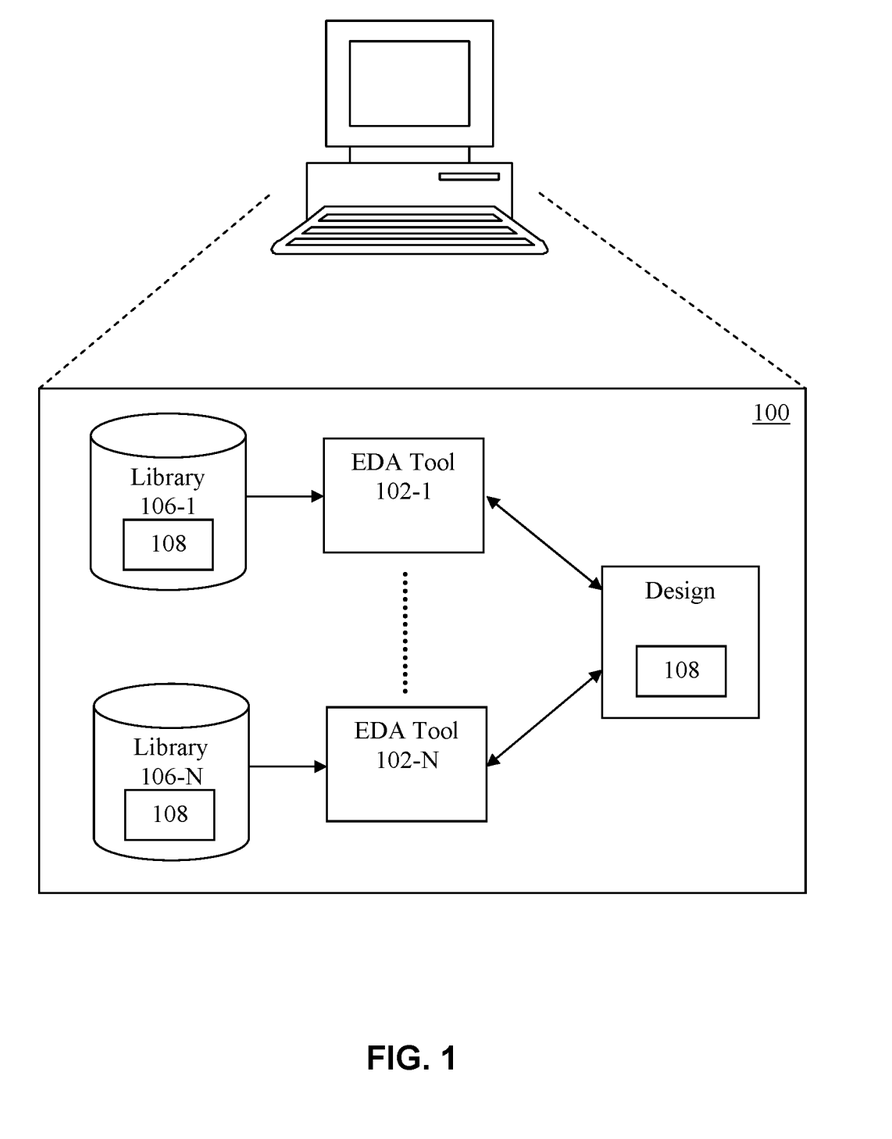
FIG. 1 is a system block diagram for illustrating aspects of the present embodiments.

To assist in illustrating various aspects of the present embodiments, FIG. 1 is a block diagram of an example design environment 100.

As shown in the example environment 100, one or more EDA tools 102-1 to 102-N are used in the process of creating and/or verifying a design 104, such as electronic circuit design tools, circuit simulation tools, layout design tools, layout verification tools, PCB design tools, mixed signal design tools, etc. It is possible that each of the EDA tools 102-1 to 102-N has access to its own library 106-1 to 106-N. These libraries 106 can include information about one or more components 108 that can be added to the design 104.

It should be noted that environment 100 can be implemented in various ways. For example, environment 100 can be implemented by one or more general purpose computers that are loaded with an operating system executing software and/or customized to include hardware for designing and verifying electronic circuits, as adapted with functionality of the present embodiments to be described in more detail below. In some embodiments, the one or more computing systems comprise and/or communicate with various components not shown such as the processor(s) or processor core(s), memory, disks, etc. The one or more computing systems may further write to and read from a local or remote volatile or non-volatile computer accessible storage not shown that stores thereon data or information such as, but not limited to, libraries 106 and design 104, and can include one or more databases such as physical design database(s), libraries, data, rule decks, constraints, etc. and/or other information or data that may be required to support the methodology of the present embodiments. In some embodiments, the one or more computing systems are implemented in a "cloud" configuration and/or a client/server configuration. For example, one or more server computers may be loaded with application software for implementing some or all of the functionality of one of EDA tools 102, and one or more client computers can communicate with the server computer(s) via a network to perform some or all of the functionality of other EDA tools 102 for a particular design. Such computing systems can further include one or more computing systems loaded with user interface functionality for providing designers with controls for designing or verifying a particular design, including providing any user-required inputs and viewing any results.

The present applicants recognize various problems with existing design environments such as design environment 100.

For example, problems can occur when a library 106 does not include data corresponding to a component 108 that needs to be added to a design 104. Moreover, even when a desired component 108 exists in libraries of all EDA tools 102 being used on a particular design 104, problems may still occur. For example, the libraries 106 of different EDA tools 102 can have different data representation formats (e.g. data corresponding to components 108) which are often not generically interchangeable across multiple similar EDA tools 102. Accordingly, when different EDA tools 102 are working on the same design 104, a component 108 that has been included in a design 104 by one EDA tool 102 may not be able to be represented by another tool 102 that is working on the design 104.

Conventionally, when a component 108 needs to be added to a library 106 or migrated between libraries of different tools 102, there are many challenges and obstacles. A common approach is to access information about the desired component from a datasheet obtained from manufacturer or provider of the desired component 108. However, even with this information, there is no generic, easy and automated way to convert symbols/designs from a document datasheet to any specific EDA tool format with all graphical shapes and attributes. This limitation not only imposes a huge manual effort to create symbols and designs from datasheets but also is extremely error prone.

The librarians and designers who are converting and/or migrating libraries and designs from one EDA tool to another also face similar challenges of inefficiency and inaccuracy. Quite often, absence of data reading-writing APIs or manually unreadable data formats further adds to this problem. There is again no generic, easy and efficient way to convert symbols/designs from one EDA tool format to another with all graphical shapes and attributes. Schematic designers and librarians are often constrained by the EDA library and design tools due to lack of built-in intelligence in the tool to convert the library symbols and designs in an efficient way.

To summarize, the present applicants recognize that some or all of the following issues are generally present in a conventional library and design creation environment: Librarians have to create symbols manually by looking at the datasheets. This is time consuming as well as error prone; Librarians have to create symbols manually in another EDA tools in the absence of data read/write APIs or readable data format. This is time consuming as well as error prone; Librarians have to make multiple efforts for library translation for different pairs of source and target tools—one each for each pair of tools due to different APIs and data format; Librarians' previously captured or symbols are not efficiently used while creating new symbols; Designers have to manually create designs from scratch by looking at the designs printed datasheets. This is time consuming as well as error prone; Designers have to re-capture designs in another EDA tool in the absence of data read/write APIs or readable data format. This is time consuming as well as error prone; The tool does not help in improving the productivity of librarians and designers over time; and The tools, methodologies, data and metadata in existing libraries and designs are not used for bringing extensibility over the Internet to improve productivity of the librarians and designers.

The present applicants have identified several prior art attempts at addressing these problems. For example, some tools provide for symbol creation from formatted datasheet tables. However, this functionality has only limited value as only a few datasheets have tabular formatted symbol data. They may only contain pin names and numbers, and not graphics, they are not scalable for designs, and they are not self-learning. Some other conventional tools provide functionality to create library symbols and designs using templates. However, this template functionality is also not fully utilizable for all symbols and designs.

According to certain aspects, therefore, the present embodiments provide an intelligent mechanism to generate library symbols and designs from a datasheet or any other tool using image processing, graphical shape and text recognition and other intelligent techniques. Embodiments use step by step processing to extract feature vectors from a symbol/design image, apply text and graphical shapes recognition using models, apply techniques for data association and write a final output for the targeted systems. These and other embodiments can also feed back the output data for further refinement of the recognition models. It should be noted that, although the following descriptions will be provided in connection with an example of generating a library or design symbol for a component such as an electronic component, that the embodiments further include generating symbols for any electronic design element that can be included in a library or design.

The library and design generation techniques according to the embodiments can be implemented by adapting one or more existing EDA tools in an environment such as environment 100, for example schematic capture tools or other tools. In other embodiments, the library and design generation techniques can be implemented using a standalone tool or system. Those skilled in the art will understand how to adapt such existing tools or implement such standalone tools after being taught by the present disclosure.

Figure 2:
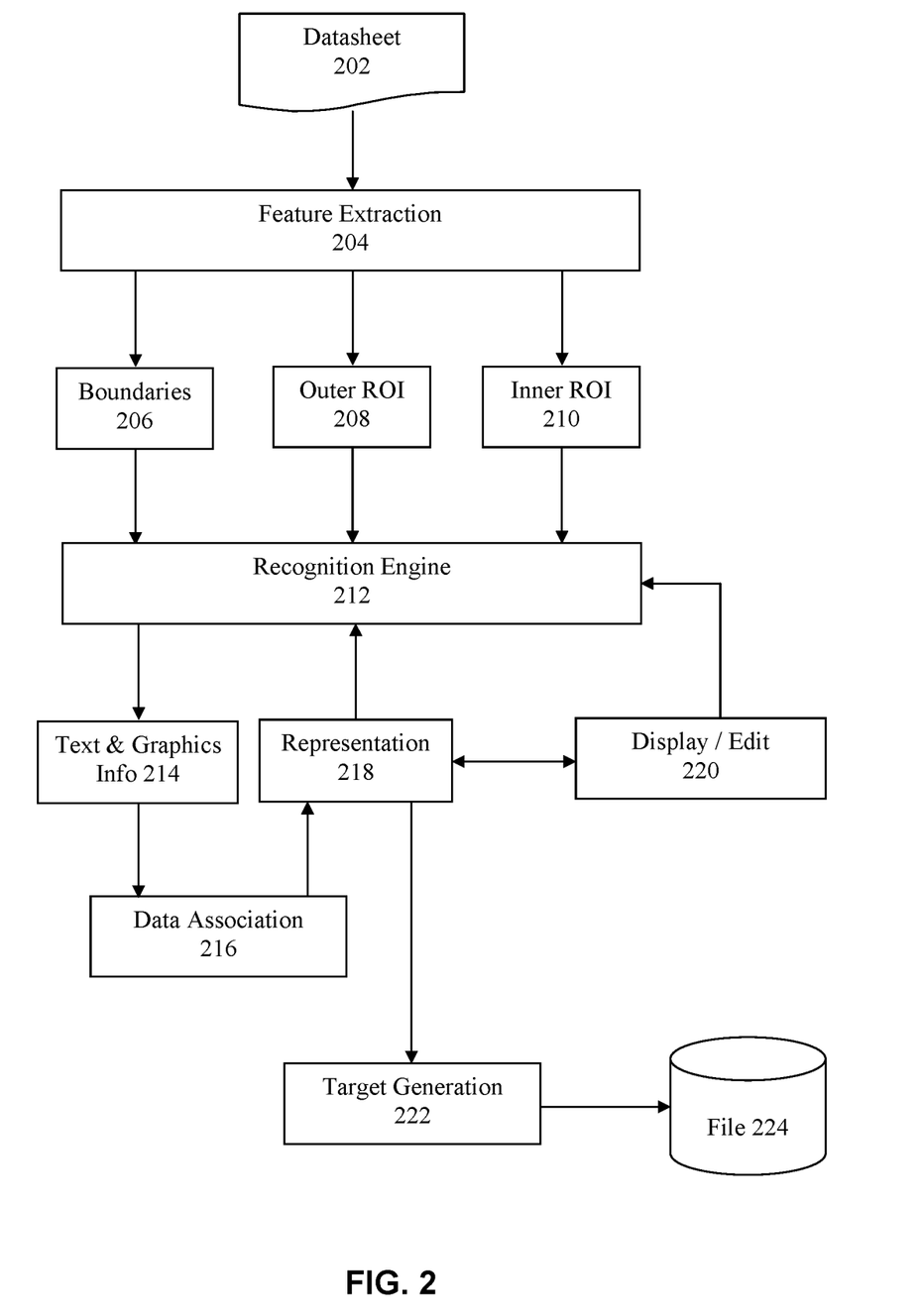
FIG. 2 is a functional block diagram of an example embodiment for generating an electronic library.

According to certain additional aspects, the present embodiments work on the principles of image processing, object recognition, data binding and intelligence based on models. FIG. 2 is an example functional block diagram illustrating aspects of the present embodiments.

Starting with a datasheet image 202, a feature extraction module 204 according to the present embodiments to be described in more detail below scans the available symbol/design image, identifies the pertinent and useful information and creates objects for storing such information. Pin numbers, pin names, symbol shape, special components, etc. are all stored in special structures that maintain their relationship with each other. The extraction process performed by module 204 according to embodiments yields well-defined representations of the pertinent portions of the image, which as a whole, and can be used to reconstruct the symbol/design in any required format.

In the example shown in FIG. 2, feature extraction module 204 performs three main tasks: detect boundaries 206, identify outer regions of interest (ROI) 208 and identify inner ROI 210. Examples of how these tasks can be performed will now be described in more detail in connection with an example input datasheet image 202 shown in FIG. 3A, which is an IC component such as a memory controller that can be included in a design for a PCB, for example.

Figure 3A:
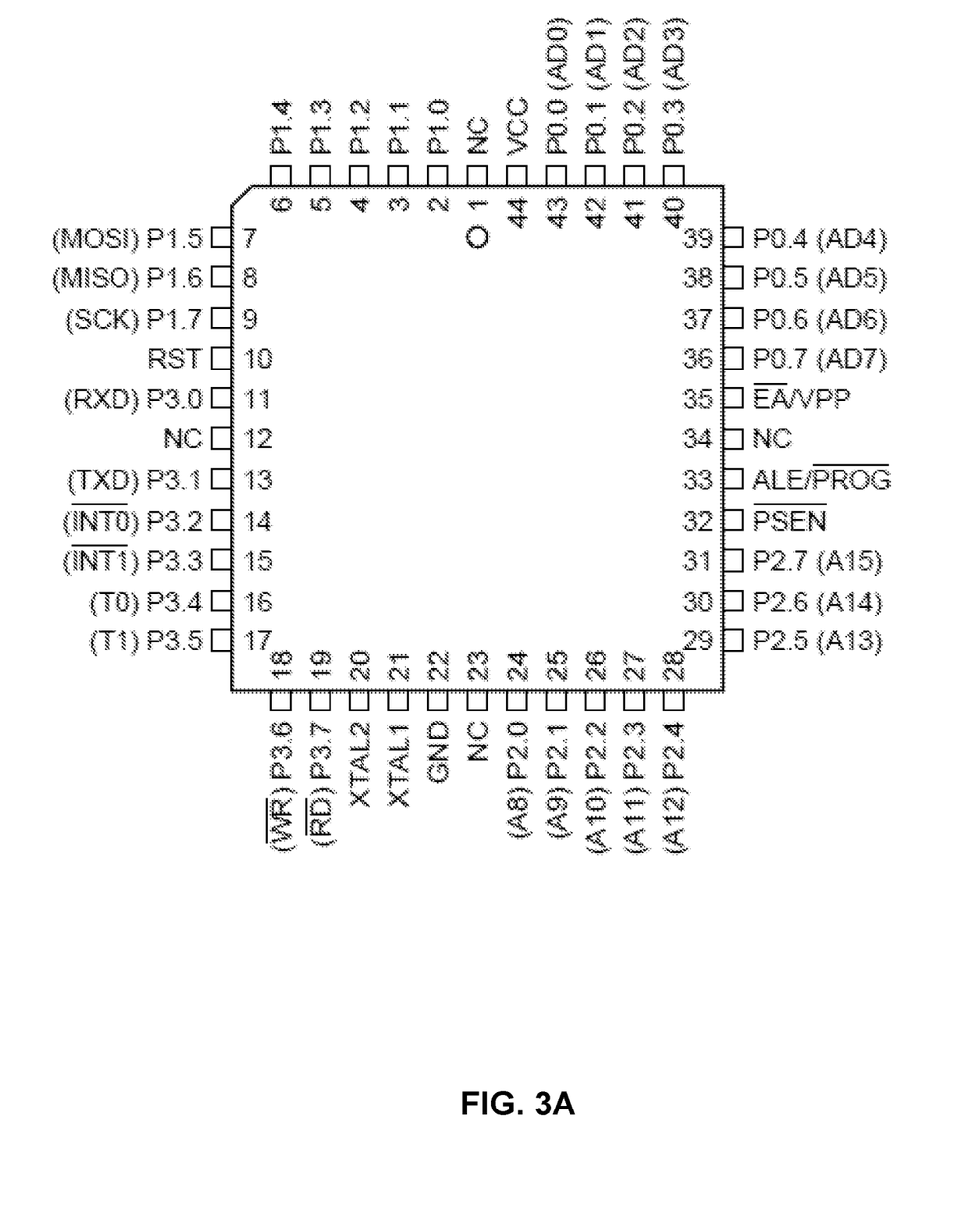
FIGS. 3A to 3G are diagrams illustrating an example process of generating an electronic library using image and text processing according to embodiments.

For example, module 204 first scans an image such as that shown in FIG. 3A into computer input image data. This can be done by performing a screen capture of a datasheet image that is accessed from a component supplier and displayed on a computer monitor, for example. Alternatively, this can be done by performing an image scan of a printed datasheet. It should be appreciated that there can be various other ways that datasheet image data can be obtained and the principles of the embodiments can include these various other ways.

Figure 3B:
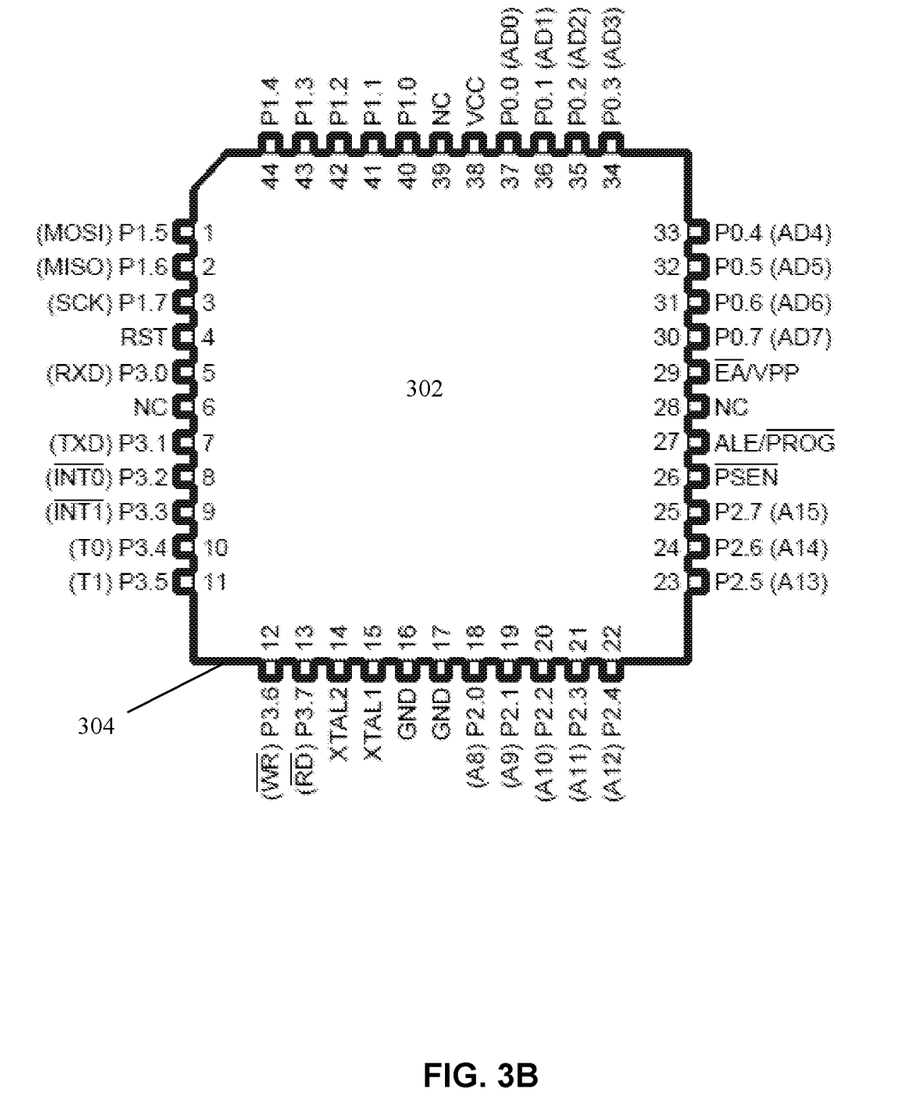

The feature extraction module 204 then attempts to find the symbol boundary in the computer input image and by consequence, its shape. For example, module 204 thresholds the image data in order to generate a binary output from it. Thereafter, module 204 finds all possible contours present in the symbol, by checking for closed regions in the image. Module 204 ascertains the largest of those closed regions and obtains the set of points comprising that region 302 in the image data, as well as the largest shape 304 encompassing the region 302, as shown in the example of FIG. 3B. A boundary 206 that is output by an example module 204 can include the symbol boundary/shape 304 as a vector of Cartesian co-ordinates, as well as a bounding rectangle (or other shape) of the symbol boundary (not shown in FIG. 3B).

An example of how feature extraction module 204 performs outer ROI 208 identification will now be described in connection with the example of FIG. 3C. Module 204 takes the results of the boundary detection process (e.g. the image data and the detected boundary/shape 304 shown in FIG. 3B) and extracts the outer regions of interest which comprise a first set 208 of related features. For example, from the bounding rectangle 312 of the boundary, module 204 ascertains the vertices and identifies the regions outside the symbol boundary by forming rectangles between the edges of the image and the symbol boundary. Module 204 then crops each of these rectangles 314 down to the minimum bounding rectangle of any content in the image, with the resulting four rectangles 314 shown in FIG. 3C.

An example of how feature extraction module 204 performs inner ROI 210 identification will now be described in connection with the example of FIG. 3D. Generally, module 204 takes the results from the previous processing and extracts the inner regions of interest which comprise the set of related features 210. For example, module 204 obtains a hierarchical representation of all given contours of the image. Contours are the continuous strokes in the image that comprise any text or graphic. These identified contours can be hierarchical in nature, which means that one contour is fully enclosed within another. For example, in FIG. 3A, all the pin numbers are enclosed within the symbol boundary. Module 204 then runs through the list of contours, eliminating those that are not contained within another contour. The contour corresponding to the symbol boundary 304 is also removed, as well as leftover noise from the resultant image, for example using a median filter, since most of the noise is of salt-and-pepper type. Module 204 then increases the brightness of the resultant image, using high boost filtering, for example. The remaining portion is the inner region of interest. A concurrent horizontal closing operation and vertical closing operation is performed, followed by a distance minimizing function in order to obtain the four most immediate inner regions 322 in the example of FIG. 3D. By comparison with FIG. 3B, it can be seen that the four resulting inner regions 322 correspond to the sets of pin numbers on the four edges in region 302 of the original symbol.

Returning to the example of FIG. 2, once the pertinent features 206, 208, 210 have been extracted from the image, a recognition engine 212 according to embodiments then attempts to extract meaning from them. An object is to obtain a complete recognition of each feature, for example using techniques whose results can be fed back for further future recognition improvements. This includes letters, numbers, special characters, as well as certain basic design component, such as resistors, capacitors, etc.

In embodiments, recognition engine 212 is implemented using models and associated input and output processes. Any suitable types of models can be used, and can be initially trained in an offline process. For example, an offline process can include repetitively feeding the models with an image having known sets of objects and text and comparing the recognized output to the known sets of objects and text. Any inaccuracies in the recognized output are manually identified and corrected and the corrected output is fed back into the models. Once a threshold accuracy is achieved, the models are considered trained. According to certain aspects, thereafter, the models can be further trained during online processing as will be described in more detail below.

Figure 3C:
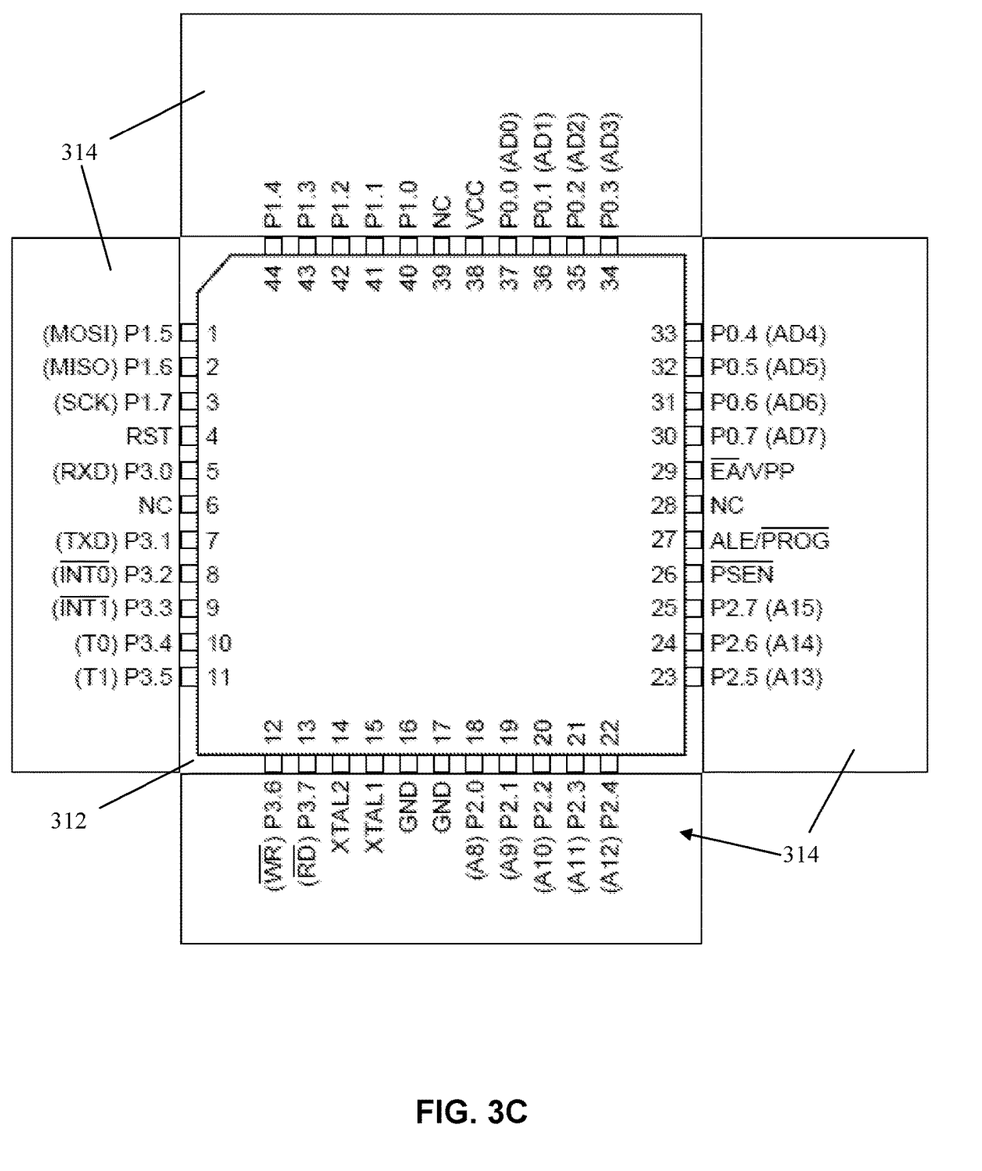
Figure 3D:
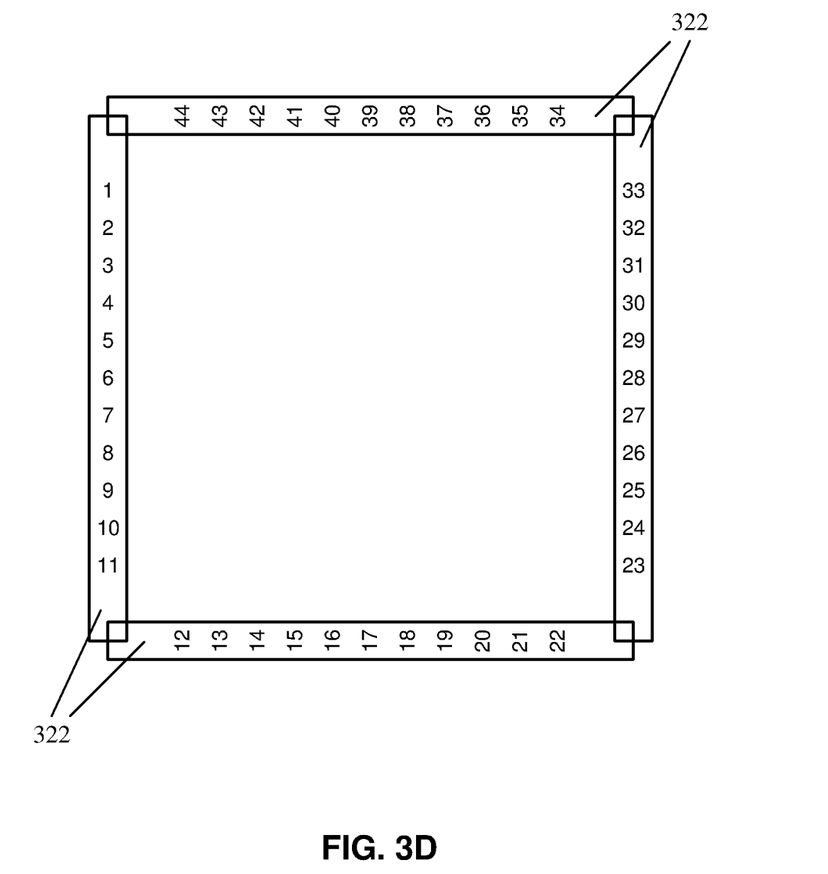
Figure 3E:
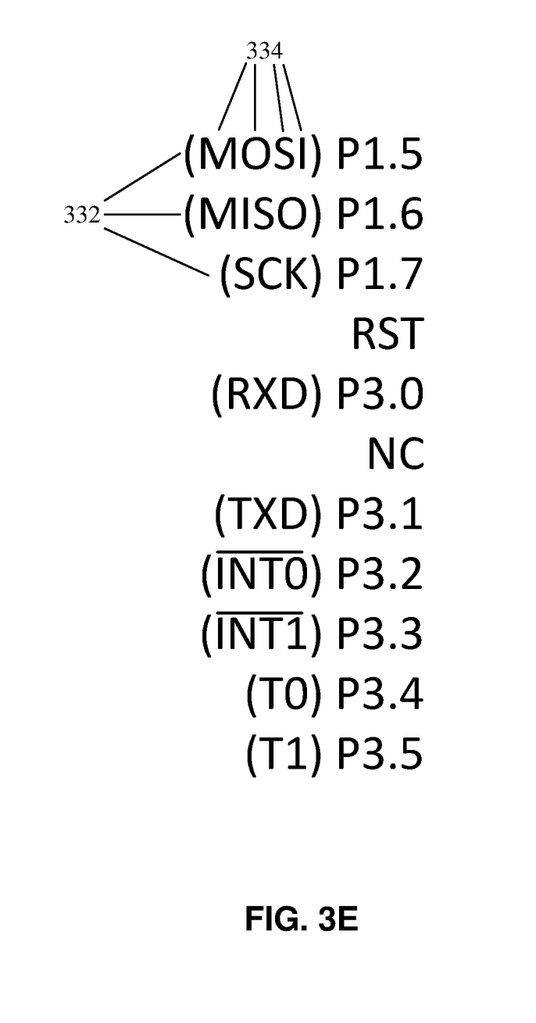

With reference to the example of FIGS. 3C and 3D, each region of interest (i.e., outer regions 314 and inner regions 322) is fed to the recognition engine 212, following which a text file of the characters and a list of the graphical objects contained in the image are generated, along with their respective locations in the image. For example, for characters, each region of interest is broken up using morphological processing, depending on its orientation, from which the engine 212 obtains singular lines of text. For example, FIG. 3E illustrates an image of the pin names from one of the outer regions 314. The recognition engine 212 recognizes the horizontal orientation of the names in the image and breaks up the image into singular lines 332. Then the pixels in each line 332 are converted to actual text. This is done by breaking the image features in each line 332 into their constituent images features 334. These are then run character by character to obtain the corresponding text, for example using well known text suggestion modules. The recognized text for each line 332 and its associated location information 214 is saved. Similar processing is also performed for identifying graphical objects in regions of interest. These graphical objects can be primitive shapes such as rectangles, squares, arcs, lines, polygons, etc., or composite shapes interpreted as schematic elements like resistors, capacitors, inductors, etc.

Figure 3F:
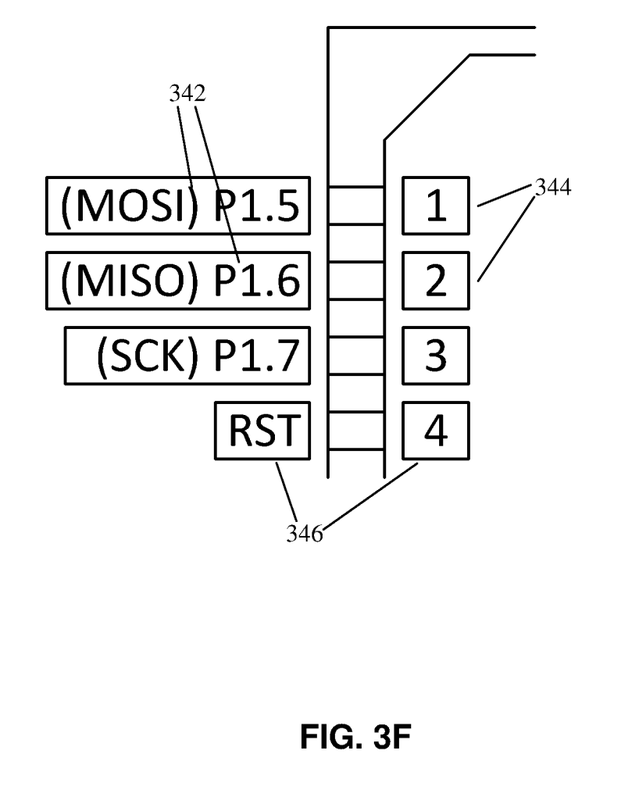

Returning to the example of FIG. 2, after obtaining the text and graphics information 214 from all of the regions of interest, a data association module 216 attempts to extract contextual information which would allow for intelligent grouping of related components. This can be done on the basis of various different criteria, most commonly being relative position or distance. Standard components can have a more specific criterion, for example, a resistor will necessarily have two pins and a name. For example, FIG. 3F shows pin names 342 recognized from one of the outer regions 314, and pin numbers 344 recognized from one of the inner regions 322. With knowledge of their locations in the image from information 214, each pin name 342 is associated with a pin number using the image coordinates of their respective bounding boxes 346, for example. Module 216 then produces a representation 218 of the pertinent image components as a whole. In the example of FIGS. 3A to 3F, the image components include a vector of the four outer regions 314, a vector of the four inner regions 322, the symbol boundary specification 304, and textual information 214 recognized from the outer and inner regions. These components are collected and placed into a pre-defined structure 218, which specifies all of the relevant positions, text, graphics, orientation, associations, etc.

Figure 3G:
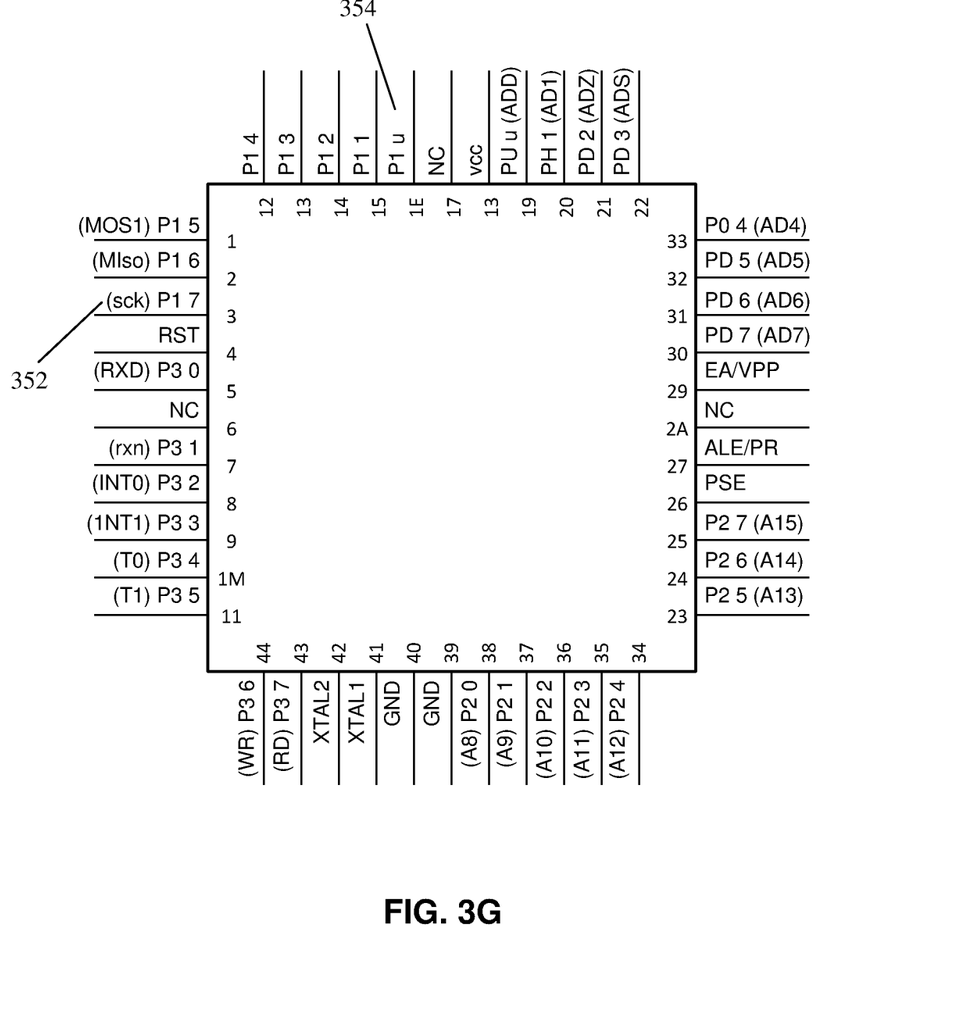

As shown in the example of FIG. 2, a correction step 220 can be performed in order to amend any wrongly recognized characters or other objects. For example, the data contained in structure 218 can be used to create an image in a graphical user interface such as the image in FIG. 3G. The user interface can further include controls for allowing a user to make corrections to text or other recognized objects (e.g. resistors, capacitors, pins, etc.). In the example of FIG. 3G, this can also include allowing the user to correct the lower case of text 352 or the improperly recognized character in text 354.

When the user starts making amendments in the generated symbol/design, the internal representation 218 of the symbol/design is updated. Moreover, these corrections are also fed back to recognition engine 212 and a self-refinement process is performed to update its models. That allows it to better perform the recognition step on the next run. Moreover, based on the corrections, the recognition engine 212 will tailor itself to the needs/eccentricities of the user. So the more the recognition engine 212 is used and made aware of its errors, the better the recognition engine 212 will become, consequently leading to a lesser need for consecutive training. For example, the recognition engine 212 could detect the letter "O" as the numeral "O" (zero) or as the letter "O". After the representation has been generated, the results may be verified by the user and requisite corrections can be made and fed back into the recognition engine. This provides a contextual refinement process, in which the likelihood of the outputs depends on the context of the inputs. For example, the last letter of "T0" (T zero) and "MISO" (MIS—Oh) in FIG. 3A will be interpreted the same on the first run of the application. However, after the user corrects it in the representation and the data is fed back into the recognition engine 212, the subsequent runs will detect them correctly.

After all of the above processing is performed, a target generation module 222 can target the representation 218 for output into a file 224 having a library or design data format that is understandable or required by any system or tool of choice. For example, for an electronic component such as that illustrated in FIG. 3A, a selected standard library format can be OrCAD, EDIF, XML/JSON, etc. and the output file 224 can be produced from representation 218 by a CAD capture tool.

It should be noted that recognition engine 212 can be implemented using any suitable types of models, such as Markov models, neural networks, face recognition modules based on Support Vector Machines (SVMs), artificial intelligence (AI) models, and text suggestion modules such as those used in auto-correction tools. These and other possible embodiments can provide a powerful image processing, recognition and machine learning based technique for schematic design and library tools, thereby improving productivity of the designers and librarians by many times. The embodiments also help in minimizing manual errors while capturing the library components from datasheets or from other source systems. Embodiments that include a self-learning method can automatically improve itself with time, yielding better results for the librarians and designers. These and other embodiments can be used for improving the creation, analysis and productivity of electronic circuit design in many different ways. Moreover, the present embodiments can eliminate the librarians' and designers' problems in the following ways: Using image processing, recognition and self learning, embodiments help librarians to automatically generate symbols from the datasheets. This not only saves time and effort but also removes inaccuracies; In these and other embodiments, librarians do not need to worry about the APIs or the format of the source system when using the system. An image or a generically available screen capture from the source system can be an effective start point for quickly generating symbol for the targeted system. This brings huge benefits in terms of efficiency and accuracy; Using such a system, the librarians do not need to worry about the different source systems. The solution works seamlessly for multiple source tools; Using the system with self learning techniques, the librarians are able to effectively use the information from already available libraries while generating new symbols; Using the image processing, recognition and self learning of some embodiments, designers can automatically generate symbols from the datasheets. This not only saves time and effort but also removes inaccuracies and designers therefore do not need to worry about the APIs or the format of the source system. An image or a generically available screen capture from the source system can be an effective starting point for quickly generating designs for the targeted system. This brings huge benefits in terms of efficiency and accuracy. The present embodiments also provide extensibility to Internet as well, as the proposed solution easily extends to the Internet Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method of configuring a tool for implementing a design of an electronic circuit including an electronic design element, the method comprising:
 obtaining an image of the electronic design element;
 generating a representation of the electronic design element from extracted features in the image based on a model;
 producing a target output based on the representation, the target output being usable by the tool for implementing the design of the electronic circuit including the electronic design element; and
 processing updates to the representation of the electronic design element to further refine the model, wherein the model is changed from a first state before the updates are processed to a second different state after the updates are processed.

2. The method of claim 1, wherein processing updates includes:
 providing a display of the representation of the electronic design element;
 receiving edits to the representation of the electronic design element; and providing the edits to a recognition engine having the model.

3. The method of claim 1, further comprising generating the extracted features by:
   identifying boundaries in the image; and
   identifying regions of interest in the image.

4. The method of claim 3, wherein identifying boundaries includes identifying a bounding shape of the electronic design element in the image, and wherein identifying regions of interest includes identifying outer regions of interest that are outside the bounding shape and identifying inner regions of interested that are inside the bounding shape.

5. The method of claim 3, wherein generating the representation includes processing the regions of interest to identify one or both of text and graphics in the image.

6. The method of claim 5, further comprising performing data association to group related text and graphics together.

7. A non-transitory computer readable storage medium comprising instructions stored thereon which, when executed by a processor, cause the processor to perform a method of configuring a tool for implementing a design of an electronic circuit including an electronic design element, the method comprising:
   obtaining an image of the electronic design element;
   generating a representation of the electronic design element from extracted features in the image based on a model;
   producing a target output based on the representation, the target output being usable by the tool for implementing the design of the electronic circuit including the electronic design element; and
   processing updates to the representation of the electronic design element to further refine the model wherein the model is changed from a first state before the updates are processed to a second different state after the updates are processed.

8. The non-transitory computer readable storage medium of claim 7, wherein processing updates includes:
   providing a display of the representation of the electronic design element;
   receiving edits to the representation of the electronic design element; and
   providing the edits to a recognition engine having the model.

9. The non-transitory computer readable storage medium of claim 7, further comprising generating the extracted features by:
   identifying boundaries in the image; and
   identifying regions of interest in the image.

10. The non-transitory computer readable storage medium of claim 9, wherein identifying boundaries includes identifying a bounding shape of the electronic design element in the image, and wherein identifying regions of interest includes identifying outer regions of interest that are outside the bounding shape and identifying inner regions of interested that are inside the bounding shape.

11. The non-transitory computer readable storage medium of claim 9, wherein generating the representation includes processing the regions of interest to identify one or both of text and graphics in the image.

12. The non-transitory computer readable storage medium of claim 11, further comprising performing data association to group related text and graphics together.

13. A system for configuring a tool for implementing a design of an electronic circuit including an electronic design element, the system comprising:
   an input for receiving an image of the electronic design element;
   a recognition engine configured to produce a representation of the electronic design element from extracted features in the image based on a model;
   a target generation module configured to produce a target output based on the representation, the target output being usable by the tool for implementing the design of the electronic circuit including the electronic design element; and
   an editing system for generating a display of the electronic design element based on the representation and for processing updates to the representation based on the display, wherein the editing system is further configured to provide the updates to the recognition engine to further refine the model, wherein the model is changed from a first state before the updates are processed to a second different state after the updates are processed.

14. The system of claim 13, wherein the input is configured to receive the image from a scan of a datasheet associated with the electronic design element.

15. The system of claim 13, wherein the input is configured to receive the image from a screen capture of a display of a datasheet associated with the electronic design element.

16. The system of claim 13, wherein the target output comprises a library file having a format recognized by the tool.

* * * * *